United States Patent [19]

Schmalzl

[11] Patent Number: 4,554,400

[45] Date of Patent: Nov. 19, 1985

[54] RADIO-FREQUENCY-TIGHT SHIELDING WITH PLANAR PARTS

[75] Inventor: Dieter Schmalzl, Munich, Fed. Rep. of Germany

[73] Assignee: Siemens Aktiengesellschaft, Berlin & Munich, Fed. Rep. of Germany

[21] Appl. No.: 630,191

[22] Filed: Jul. 12, 1984

[30] Foreign Application Priority Data

Aug. 5, 1983 [DE] Fed. Rep. of Germany ....... 3328395

[51] Int. Cl.$^4$ .............................................. H05K 9/00
[52] U.S. Cl. ................................. 174/35 GC; 361/424
[58] Field of Search .......... 174/35 GC, 35 R, 35 MS, 174/51; 219/10.55 D; 361/424; 455/300, 301

[56] References Cited

U.S. PATENT DOCUMENTS 3,277,230  10/1966  Stickney et al. ............... 174/35 GC
3,504,095  3/1970  Roberson et al. ............. 174/35 GC

*Primary Examiner*—A. T. Grimley
*Assistant Examiner*—D. A. Tone

*Attorney, Agent, or Firm*—Hill, Van Santen, Steadman & Simpson

[57] ABSTRACT

The RF shielding of electronic devices with a frame and sheet metal structure to form coverings for the electrical parts characterized by the structure having planar parts provided with springs to insure contact between the metal parts. Each of the springs has a pair of tabs which are connected to a center portion by a pair of bent portions having bends in at least two directions to form humps or arcuate portions. The springs are secured to the planar part by having the ends extending through a pair of apertures with the tabs engaging one side of the planar part and the center portion contacting an abutment surface between the apertures to insure that the bent portions curve above the outer surface. The abutment in the planar part may include an aperture and the center portion may have a bent nose that extends into the aperture. In another embodiment, the center portion is bent to form a nose portion which engages a web forming the abutment.

13 Claims, 13 Drawing Figures

RADIO-FREQUENCY-TIGHT SHIELDING WITH PLANAR PARTS

BACKGROUND OF THE INVENTION

The present invention is directed to radio-frequency tight shielding of electronic devices particularly electronic devices of the data technology with a frame and sheet metal structure having planar parts.

SUMMARY OF THE INVENTION

The object of the invention is to create an easily interchangeable contact part for use with parts such as metal sheets and frame members of a structure used for radio frequency proof shielding of electronic devices In order to achieve this object, the present invention is directed to an improvement for radio-frequency tight shielding for electronic devices particularly electronic devices of data technology wherein the shielding is composed of frame and sheet members having planar parts. The improvement is that each planar part has at least one spring being securable to the part, each spring having two end tabs connected by bent portions to a center portion extending between the two bent portions, each bent portion having at least two bends extending in opposite directions to form a hump shape, said planar part for each spring having a pair of spaced-apart apertures with an abutment disposed therebeween on one surface, said spring being assembled on the planar part with the two tabs extending through the spaced-apart apertures to engage the other side of the planar part as the center portion presses against the abutment of the planar part and the bent portions extend above the one side.

The center portion of the spring can be a curved portion or can be bent to form either a supporting nose extending in the same direction as the hump shapes of the bent portions or in the opposite direction. The abutment can consist of two webs having an aperture disposed therebetween which receives the supporting nose that extends in a direction opposite to the hump-shaped bent portions. The two webs can be pressed or stamped out of the plane of the planar part so that the spring comes to lie in this stamped or embossed portion when compressed by the assembly of the part with another part or frame member.

The abutment can also be a single web which extends between the pair of spaced apertures and the center portion of the spring is bent to extend in the same direction as the bent portions and to receive this web by engaging it on three sides.

As a result of these measures, one obtains a single metal clip that can be snapped into the spaced apertures of a sheet metal part. The metal spring will anchor and fix itself in the apertures by means of a lock-in due to its shape, and it will encounter an overelongation seat at the sheet metal surface which simultaneously acts as a contact location and is largely insensitive. The seating both in the facade as well as at the frame form a fixed double contact. The spring is easy to incorporate or respectively replace and is therefore provided in devices in order to simplify assembly or mounting. It permits a great tolerance compensation and it can also be applied to thin facades or outer sheet covering because it only dips slightly into the facade despite a large spring excursion.

Only one shape hole is required for fastening the spring and this can be fabricated with hardly any additional cost given general perforations of the sheet metal parts. The shaped hole can be provided around the facade or covering sheet during manufacturing so that the fit with a larger or smaller numbers of springs can occur depending on the requirements of the built-in electronics.

When a shaped hole is provided by stamping or during punching such as mentioned above, then the shielding effect can be increased as a result of the slight distance between the facade and the frame since the spring will dip into this depression or stamped portion.

DESCRIPTION OF THE PREFERRED EMBODIMENTS

Figure 1:
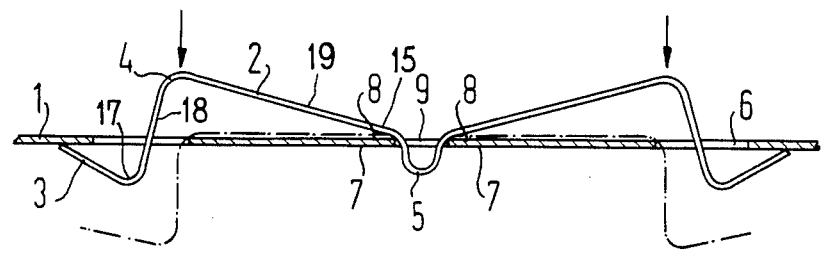
FIG. 1 is a cross-sectional view with portions in elevation of a spring having flat humps or low portions mounted in a part according the present invention.

The principles of the present invention are particularly useful in a spring 2 which is illustrated as being assembled onto a planar part 1. The spring 2 has a pair of end tabs 3 which are interconnected by a bent portion 4 to a center portion 15. As illustrated, the center portion 15 has a pair of bends to form a supporting nose 5. Each of the bent portions 4 consists of a first right angle bend 16 and a second substantially right angle bend 17 so as to form a curved or hump shape. As illustrated, a leg portion 18 interconnecting the bends 16 and 17 is shorter than a leg portion 19 which connects the bend 16 to the center portion 15.

The planar part 1 for each of the springs 2 is provided with a pair of spaced apertures 6 which are separated by an abutment 8 with a center aperture 9. When the spring 2 is inserted, the legs 18 connected to the tabs 3 extend through the apertures 6 so the tabs 3 can engage the other side surface 7 of the planar part 1 as the abutments 8 on the one side are engaged by the center portion 15 adjacent the supporting nose 5 which extends into the aperture 9. It should be pointed out that the spring is slightly flexed in this position so that the end of the tabs 3 are urged into the surface 7 as the center portion 15 is urged into engagement with the abutment surfaces to latch the spring in place. When the planar part 1 is assembled with another part, compressive forces, which are indicated by the arrows, move the two humps formed by the bent portions 4 into contact with the one surface so that the tabs 3 lift off of the surface 7 of the planar part as shown in chain lines. Due to this spring action, a good contact is formed at this location between the planar part and its other counterpart.

Figure 2:
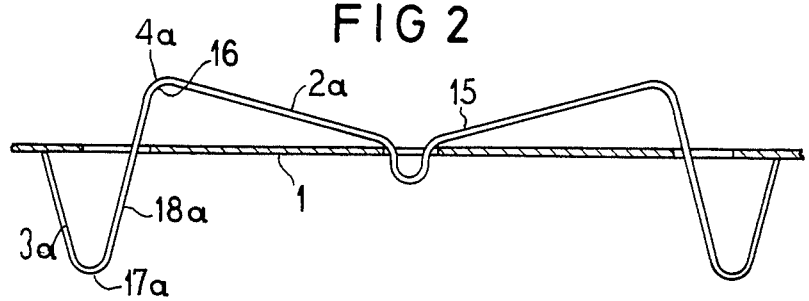
FIG. 2 is a cross-sectional view with portions in elevation of an embodiment of the spring having a higher hump or curved portion.

A spring that functions in the same manner as the above described spring is illustrated in FIG. 2 by the spring 2a. In the spring 2a, the bent portion 4a has a longer short leg 18a and the bend 17a is sharper with the leg 18a so that the tab 3a is longer and forms a sharper angle. Thus, the tab 3a and the leg 18a have a V-shaped configuration as illustrated. The tabs 3a therefore project further into the inside of the planar part 1 and an easier engagement of the spring is achieved by means of a steeper angle and longer legs of the tabs 3a and the legs 18a. It should be noted that the remaining legs such as 19 and the center portion 15 all have the same configuration as the spring 2 of FIG. 1.

Figure 3:
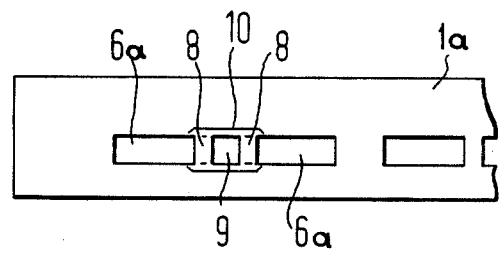
FIG. 3 is a plan view of a planar part showing a shaped perforation.
Figure 4:
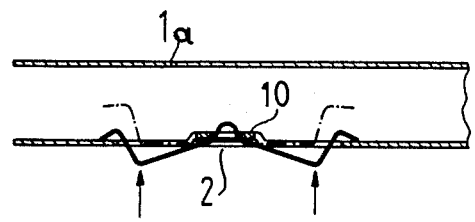
FIG. 4 is a cross-sectional view of the part of FIG. 3 illustrating a spring inserted therein.

In FIG. 3, a plan view of a planar part 1a is illustrated. As illustrated, the spaced-apart apertures 6 are shown with the aperture 9 for the support nose. Also, it can be seen that the aperture 9 is spaced from the apertures 6a by the abutment surfaces 8 which have a web shape. In this particular embodiment, the portion of the planar part has been stamped or embossed so that a portion 10 is depressed or offset inward as illustrated in FIG. 4. As shown in FIG. 4, when a spring such as 2 is assembled on the part 1a, the stamping or depression 10 surrounding the aperture 9 is such that the spring 2, when assembled, will assume the position shown in solid lines but can be depressed or moved to the position of chain lines which is flush with the inside wall or facade of the part 1a. This enables a more beneficial RF shielding effect to be obtained.

Figure 5:
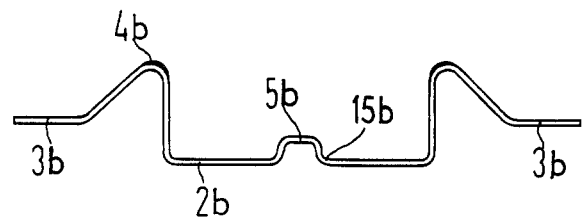
FIG. 5 is a side view of another embodiment of the spring of the invention.
Figure 6:
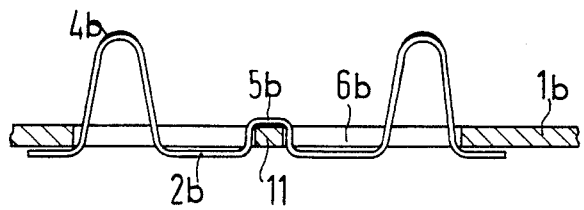
FIG. 6 is a partial cross-sectional view with portions in elevation of the embodiment of FIG. 5 being assembled in the planar part.
Figure 7:
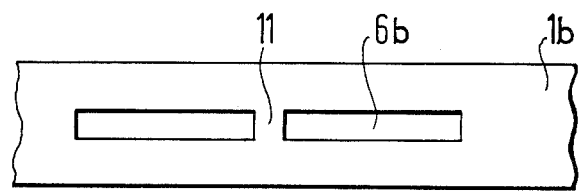
FIG. 7 is a plan view of the apertures in the planar part of FIG. 6.

Another embodiment of the spring is illustrated by the spring 2b in FIG. 5. In this embodiment, the center portion 15b has a nose portion 5b which is bent into a U shape in the same direction as the bent portions 4b. As illustrated in FIGS. 6 and 7, the spring 2b is used with a planar part 1b which has apertures 6b which extend toward each other and are separated only by a narrow web portion 11. When the spring 2b is assembled, the nose portion 5b engages the web 11 as the tabs 3b engage the opposite edges of the aperture 6b. It is noted that in this arrangement the bent portions 4b are resiliently compressed as the spring element is inserted into the planar part 1b. When the planar part is then assembled with other frame parts, the bent portions 4b are pressed down so that the tabs 3b will move away from the back side of the planar part 1b. However, the bent portions 4b maintain engagement with the associated part to insure contact therebetween.

Figure 8:
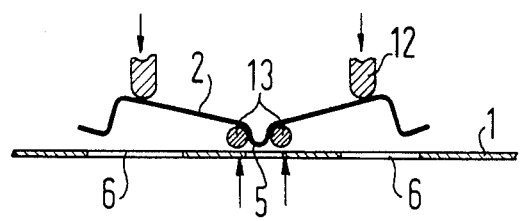
FIG. 8 is a schematic illustration of a first step for assembling the spring of FIG. 1 into a planar part.
Figure 9:
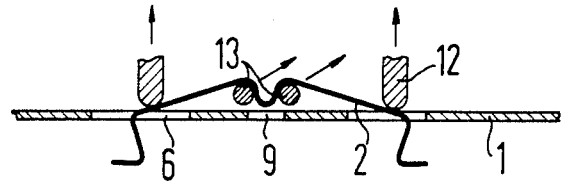
FIG. 9 is a schematic cross-sectional view of a second step of the assembly of the spring of FIG. 1 into a planar part.
Figure 10:
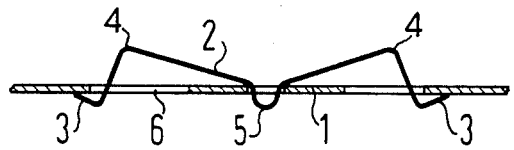
FIG. 10 is a schematic cross-sectional view illustrating the spring after the completion of the third step of assembly.

To assemble a spring 2 of FIG. 1 into the planar part 1 of FIG. 1, the methods for a machine to automatically insert the spring are illustrated in FIGS. 8, 9 and 10. As illustrated in FIG. 8, a pair of pins 13 are laid on the planar part 1 to engage the supporting nose 5. A pair of tools 12 act on the bent portions 4 to press these portions down into the openings or apertures 6 as illustrated in FIG. 9. With the bent portions depressed into the openings 6, the pins 13 are withdrawn so that the supporting nose 5 can snap into the opening or aperture 9. Then the tools 12 are raised so that the spring 2 relaxes and allows the two tabs 3 to engage the back side of the planar part 1 as the bent portions 4 assume the position illustrated in FIG. 10 which is substantially the same as that of FIG. 1.

Figure 11:
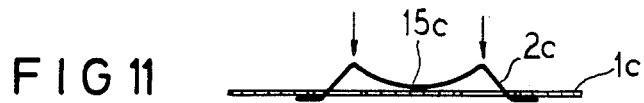
FIG. 11 is a cross-sectional view with portions in elevation illustrating another embodiment of the spring in accordance with the present invention.
Figure 12:
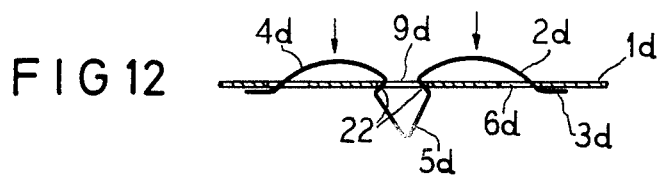
FIG. 12 is a cross-sectional view with portions in elevation of a still, further embodiment of the spring in accordance with the present invention.
Figure 13:
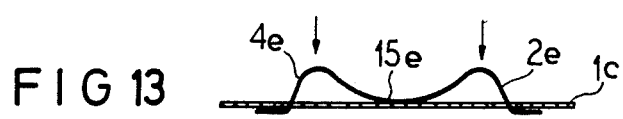
FIG. 13 is a cross-sectional view with portions in elevation of yet another embodiment of the spring in accordance with the present invention.

In FIGS. 11, 12 and 13, three additional embodiments of the springs are illustrated. In the embodiment of FIG. 11, a spring 2c has a center portion 15c which does not have the supporting nose 5 and thus bears against a portion of the planar part 1c that extends between apertures 6c.

In the embodiment of FIG. 12, the center portion is provided with a supporting nose 5d which has a triangular shape with short legs or shoulder portions such as 22 which allow the nose 5d to be snapped into an aperture 9d of the part 1d as the tabs 3d are inserted through aperture 6d. It is noted that the bent portions 4d have a more gradual curvature and extend from a bend adjacent the shoulders 22 to a bend adjacent the tab 3d.

An embodiment of the spring 2e of FIG. 13 like the embodiment 2c has a center portion 15e which is without a nose and contacts the surface or abutment of the planar part 1e, which abutment is between two apertures. It is noted that one of the bends forming the bent portion 4e is rounded so that the hump is more of a smooth arcuate surface.

Although various minor modifications may be suggested by those versed in the art, it should be understood that I wish to embody within the scope of the patent granted hereon, all such modifications as reasonably and properly come within the scope of my contribution to the art.

I claim:

1. In a radio-frequency-tight shield for an electronic device, said shield having a frame and sheet metal structure with planar parts, the improvements comprising each of the planar parts having at least one spring being securable thereto, said spring having two end tabs connected by bent portions to a center portion extending between the bent portions, each of the bent portions having at least two bends extending in opposite directions to form a hump shape, said planar part for each spring having a pair of spaced-apart apertures with an abutment disposed therebetween on one side, said spring being assembled on the planar part with the two tabs extending through the spaced-apart apertures to engage the other side of the planar part as the center portion presses against the abutment and the bent portions extend above the one side.

2. In a radio-frequency-tight shield according to claim 1, wherein the center portion is bent to form a supporting nose extending in a direction opposite to the direction of the hump shape of the bent portions, and wherein said planar part between the pair of apertures has a center aperture separated from each of the pair of apertures by a web, said center aperture receiving the supporting nose as the tabs extend through the spaced-apart apertures and engage the other side of the part.

3. In a radio-frequency-tight shield according to claim 2, wherein the portion of the planar part containing the center aperture and the two webs lies in a portion of the planar part which has been pressed out of the plane of the surface thereof.

4. In a radio-frequency-tight shield according to claim 2, wherein the supporting nose has a shape with a pair of shoulders so that it forms a snap fit with the center aperture.

5. In a radio-frequency-tight shield according to claim 1, wherein the pair of spaced-apart apertures are separated by a thin web, and wherein the center portion has a nose with a U-shaped bend extending in the direction of the hump shape of the bent portion for engaging said web on three surfaces.

6. In a radio-frequency-tight shield according to claim 1, wherein the abutment is a smooth portion of the planar part disposed between said apertures and wherein the center portion comprises a curved surface engaging said abutment.

7. In a radio-frequency-tight shield according to claim 1, wherein the abutment has a center aperture, and said center portion has a bent nose portion engageable in the center portion with a snap fit.

8. A spring contact comprising a member with a spring element being assembled therein said member having a planar surface with at least two spaced-apart apertures with an abutment on one surface therebetween, and said spring element having a pair of tabs each connected by a bent portion to a center portion, each bent portion being formed by at least two bends in the spring element extending in opposite directions, said spring element being assembled on the member with the tab portions extending through the spaced apertures and the center portion engaging the abutment as the tabs engage the other side of the planar surface to form a resilient contact.

9. A spring contact according to claim 8, wherein the abutment is a continuous surface and the center portion is a curved portion engaging said surface.

10. A spring contact according to claim 9, wherein the abutment is formed by a web with a planar surface extending between the pair of spaced apertures, and said center portion has a U-shaped bent portion engaging said web on the planar surface and the edges of the apertures.

11. A spring contact according to claim 8, wherein the abutment includes a center aperture and the center portion includes a bent portion forming a supporting nose extending into said aperture as the tabs engage the opposite side of the member.

12. A spring contact according to claim 11, wherein the bent portion forming the nose has a triangular configuration with shoulder portions so that the nose snaps into the center aperture.

13. A spring contact according to claim 11, wherein a portion adjacent the center aperture including webs extending between the center aperture and the spaced-apart apertures, said webs lie in a depressed offset portion of the planar part so that the spring element can be deflected to lie flush in the plane of the planar part.

* * * * *